US012785695B2

(12) United States Patent
Dvir et al.

(10) Patent No.: US 12,785,695 B2
(45) Date of Patent: Nov. 3, 2026

(54) METHODS AND SYSTEMS FOR ADJUSTING PHASE LOCK LOOP DEVICES

(71) Applicant: Avago Technologies International Sales Pte. Limited, Singapore (SG)

(72) Inventors: Amiad Dvir, Aliso Viejo, CA (US); Gregory Alyn Unruh, San Clemente, CA (US); Ryan Edgar Hirth, Windsor, CA (US); Da Xia, Irvine, CA (US); Xianwen Fang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 46 days.

(21) Appl. No.: 18/958,855

(22) Filed: Nov. 25, 2024

(65) Prior Publication Data

US 2026/0149455 A1 May 28, 2026

(51) Int. Cl.

| | |
|---|---|
| ***H03L 7/08*** | (2006.01) |
| ***H03L 7/093*** | (2006.01) |
| ***H03L 7/197*** | (2006.01) |
| ***H04L 7/033*** | (2006.01) |

(52) U.S. Cl.

CPC ............ *H03L 7/0807* (2013.01); *H03L 7/093* (2013.01); *H03L 7/1974* (2013.01); *H04L 7/0331* (2013.01)

(58) Field of Classification Search

CPC ..... H03L 7/0807; H03L 7/093; H03L 7/1974; H04L 7/0331

See application file for complete search history.

(56) References Cited

U.S. PATENT DOCUMENTS

| | | | |
|---|---|---|---|
| 7,365,580 | B2 | 4/2008 | Martin et al. |
| 7,777,576 | B2 | 8/2010 | Waheed et al. |
| 8,674,731 | B1 | 3/2014 | Hellmer et al. |
| 8,803,572 | B2 | 8/2014 | Kumar et al. |

(Continued)

FOREIGN PATENT DOCUMENTS

| | | | |
|---|---|---|---|
| CN | 116418340 | A | 7/2023 |
| KR | 10-2012-0016976 | A | 2/2012 |

OTHER PUBLICATIONS

Bhowmik, et al., Clock Jitter Reduction and Flat Frequency Generation in PLL Using Autogenerated Control Feedback, IEEE Transactions on Components, Packaging and Manufacturing Technology, vol. 7, No. 11, Nov. 2017, pp. 1832-1841.

(Continued)

*Primary Examiner* — Janice N Tieu

(74) *Attorney, Agent, or Firm* — Quarles & Brady LLP

(57) ABSTRACT

Methods and systems for adjusting phase lock loop devices. In a specific embodiment, the subject technology provides a system that includes a sampler for generating samples from a first data stream and a clock and data recovery (CDR) circuit to determine phase offset and generate a first control code. The system also includes a phase interpolator produces a first clock signal based on the first control code and a second clock signal. The system includes a first filter configured to track the phase interpolator movement, and it generates a second control code that includes a fractional divider value. The system includes a phase-locked loop (PLL) circuit that uses a reference clock to generate the second clock signal based on the third clock signal and the second control code. There are other embodiments as well.

20 Claims, 4 Drawing Sheets

(56) References Cited

U.S. PATENT DOCUMENTS

| | | | | |
|---|---|---|---|---|
| 11,658,648 | B1 * | 5/2023 | Jeon | H03L 7/081 327/156 |
| 11,849,015 | B1 * | 12/2023 | Zhao | H03L 7/0807 |
| 2009/0160560 | A1 | 6/2009 | Song et al. | |
| 2021/0409031 | A1 * | 12/2021 | Ranganathan | H03L 7/1974 |
| 2022/0209930 | A1 * | 6/2022 | Kim | H04L 7/0004 |
| 2024/0044978 | A1 * | 2/2024 | Mandal | G01R 31/3171 |
| 2024/0297656 | A1 * | 9/2024 | Gong | H03L 7/0992 |

OTHER PUBLICATIONS

Mansuri, et al., Jitter Optimization Based on Phase-Locked Loop Design Parameters, 2002 IEEE International Solid- State Circuits Conference, 0-7803-7335-9, 3 pages.

* cited by examiner

METHODS AND SYSTEMS FOR ADJUSTING PHASE LOCK LOOP DEVICES

FIELD OF INVENTION

The subject technology is directed to electrical circuits and methods thereof.

BACKGROUND OF THE INVENTION

Phase-locked loops (PLLs) are important components in modern electronic systems, particularly in communication, data processing, and signal processing applications. Their primary function is to synchronize an output signal with a reference signal in both frequency and phase. This synchronization is crucial for ensuring stable data transmission, reducing noise, and managing timing within the system.

For example, in high-speed data communication and networking applications, PLLs are used for clock recovery and data alignment, ensuring that transmitted and received signals are synchronized. As the demand for faster data rates and higher bandwidths increases, the need for more accurate and reliable PLL performance has grown. High-speed applications, such as optical networks, 5G wireless communications, and high-performance computing, all place stringent requirements on PLLs to minimize timing errors, phase noise, and jitter.

Unfortunately, existing approaches have been inadequate for reasons further explained below. Improved methods and systems for adjusting phase lock loop devices are desired.

DETAILED DESCRIPTION OF THE INVENTION

Figure 1:
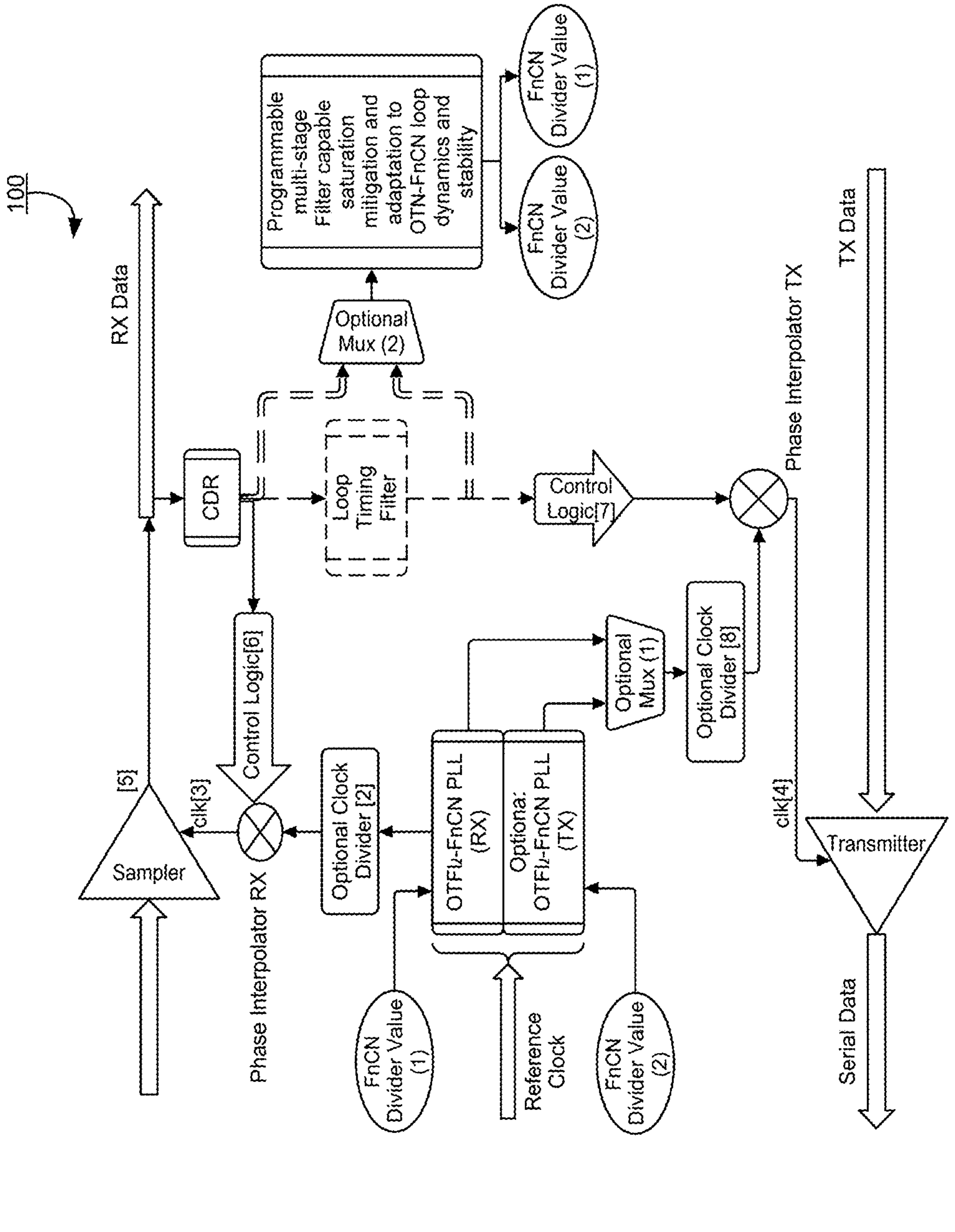
FIG. 1 is a simplified diagram illustrating a system for adjusting PLL according to embodiments of the subject technology.

Methods and systems for adjusting phase lock loop devices. In a specific embodiment, the subject technology provides a system that includes a sampler for generating samples from a first data stream and a clock and data recovery (CDR) circuit to determine phase offset and generate a first control code. The system also includes a phase interpolator that produces a first clock signal based on the first control code and a second clock signal. The system includes a first filter configured to track the phase interpolator movement, and it generates a second control code that includes a fractional divider value. The system includes a phase-locked loop (PLL) circuit that uses a reference clock to generate the second clock signal based on the third clock signal and the second control code. The system also includes a loop timing filter for noise reduction and a programmable multi-stage filter to adjust the gain. There are other embodiments as well.

As mentioned above, existing approaches for PLL devices are inadequate. In various embodiments, the present invention provides a more cost-sensitive solution that eliminates the need for high-stability reference clocks by providing a method to manage and compensate for inaccuracies, allowing the design to tolerate variations in clock stability while still maintaining the high level of performance required by the application. To maintain accuracy, PLLs typically rely on highly stable and precise reference clocks, which can be costly and susceptible to temperature fluctuations, aging, and manufacturing variations. Additionally, PLLs are sensitive to periodic jitter (PJ), phase noise, and other types of timing errors that can degrade signal quality. In applications like data communications, where signal integrity is critical, even minor jitter can lead to data errors, reduced bandwidth efficiency, and lower overall performance. Higher accuracy reference clocks, advanced filtering, and complex control systems can drive up both the cost and power consumption of PLL systems. For applications in consumer electronics, telecommunications, and large-scale data centers, cost-effective and power-efficient solutions are increasingly important.

More specifically, in existing PLL-based clock recovery circuits, the accuracy and stability of the reference clock impose limitations on the PLL's locking range and the system's jitter tolerance. It is to be appreciated that embodiments of the subject technology provide a dynamic PLL tuning mechanism that reduces dependence on highly stable reference clocks, thus allowing it to handle a wider range of jitter conditions without frequent recalibration. For example, by using a programmable multi-stage filter, an exemplary system according to the subject technology isolates the jitter on the RX side, managing RX jitter through wide-bandwidth clock recovery and enabling fast phase adjustments. The filter can recover and apply filtered phase movements from the RX phase interpolator to the TX side, which helps in achieving the target jitter specifications for data transmission.

In various embodiments, an exemplary system according to the subject technology includes a loop timing filter designed to remove high-frequency noise from control signals, which prevents unwanted phase noise and periodic jitter from propagating through the system. For example, the filter can be beneficial in high-speed communication environments like passive optical networks (PON), where precise timing and low jitter are important.

Some embodiments of the subject technology are configured with a dual-PLL architecture, where one PLL is used to lock the reference clock while the other manages loop timing. This approach enables the system to adapt phase interpolator movements proportionally, reducing noise sensitivity and enhancing loop timing accuracy.

In various implementations, the subject technology addresses sources of periodic jitter, especially those arising from the PLL and phase interpolator. Non-linearities in phase interpolator steps, such as discrete non-linearities (DNL) and integral non-linearities (INL), can introduce timing errors that propagate through the system. By using a fractional divider with on-the-fly adjustment capability to mitigate these effects, it enables real-time frequency and phase adjustments without introducing clock glitches. For example, using a range converter and decision circuit to track residual PPM offsets and update the fractional divider, an embodiment of the subject technology reduces the effects of frequency drift and phase noise, thereby minimizing the impact of DNL and INL on timing precision. In some implementations, a system according to the subject technology synchronizes TX and RX clock phases by transmitting filtered RX phase movements to the TX phase interpolator.

It is to be appreciated that embodiments of the subject technology can support many applications, such as optical networks requiring precise jitter management due to stringent standards on jitter transfer from RX to TX paths.

The following description is presented to enable one of ordinary skill in the art to make and use the invention and to incorporate it in the context of particular applications. Various modifications, as well as a variety of uses in different applications, will be readily apparent to those skilled in the art, and the general principles defined herein may be applied to a wide range of embodiments. Thus, the subject technology is not intended to be limited to the embodiments presented, but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes a method, which comprises: receiving a first data stream, the first data stream being characterized by a first data rate; determining timing information associated with the data stream and the first data rate; determining a first phase interpolator offset, the first phase interpolator offset being a factor of time and being associated with the timing information; selecting a gain using at least the first phase interpolator offset; generating a first fractional divider value for reducing the first phase interpolator offset, the first fractional divider value being associated with the gain; generating a first clock signal using at least the first fractional divider value and a reference clock signal; and transmitting a second data stream using at least the first clock signal.

Implementations may include one or more of the following features. The timing information is derived from a clock data recovery (CDR) circuit that aligns the first data stream with the reference clock signal. The method may further comprise sampling the first data stream with a CDR circuit to determine a transient phase offset and generate a first control code. The method may further comprise performing phase interpolation using the first control code and the first clock signal to generate a second clock signal. The method may further comprise sampling the first data stream using the second clock signal. The method may further comprise generating a second control code by filtering the first control code. The method may further comprise performing phase interpolation using the second control code and the first clock signal. The method may further comprise determining a second phase interpolator offset, the first phase interpolator offset being associated with the second data stream. The method may further comprise storing the first fractional divider value in a look-up table (LUT).

According to another embodiment, the subject technology provides a system, which comprises: a sampler configured to generate samples using a first data stream; a clock and data recovery (CDR) circuit configured to determine a phase offset using at least the samples and generate a first control code; a first phase interpolator configured to generate a first clock signal using at least the first control code and a second clock signal; a first filter configured to generate a second control code by determining a movement of the first phase interpolator using at least the first control code; a reference clock configured to provide a third clock signal; and a phase-lock loop circuit configured to generate the second clock signal using the third clock signal and the second control code.

Implementations may include one or more of the following features. The system may further comprise a loop timing filter configured to remove high-frequency noises from the first control code. The first filter comprises an integration module for determining an adjustment gain. The second control code comprises a fractional divider value. The first filter comprises a programmable multi-stage filter configured to determine a gain associated with the second control code. The system may further comprise a second phase interpolator configured to generate a fourth clock signal using at least the first control code and the second clock signal, the fourth clock being used for data transmission. The sampler is configured to perform sampling using at least the first clock signal.

According to yet another embodiment, the subject technology provides a system, which comprises: a sampler configured to generate samples using a first data stream and a first clock signal; a clock and data recovery (CDR) circuit configured to generate a first control code using at least the samples; a first phase interpolator configured to generate the first clock signal using at least the first control code and a second clock signal; a first filter configured to generate a second control code by determining a movement of the first phase interpolator using at least the first control code; a reference clock configured to provide a third clock signal; and a first phase-lock loop circuit configure to generate the second clock signal using the third clock signal and the second control code. In one or more embodiments, the system may further comprise a loop timing filter configured to remove noise from the first control code. The system may further comprise a second phase-lock loop circuit configured to generate a fourth clock signal using the third clock signal and a third control code; and a second phase interpolator configured to generate a fifth clock signal using at least the first control code and the fourth clock signal. The first filter is configured to generate the third control code based on a movement of the second phase interpolator.

According to yet another embodiment, the subject technology provides a system, which comprises: a sampler configured to generate samples from a first data stream characterized by a first data rate; a clock and data recovery (CDR) circuit configured to determine timing information associated with the first data stream and the first data rate and generate a first control code; a first phase interpolator configured to generate a first clock signal using at least the first control code and a reference clock signal; a first filter configured to generate a first fractional divider value by selecting a gain associated with a phase offset determined from the timing information; a phase-locked loop (PLL) circuit configured to generate the first clock signal using at least the reference clock signal and the first fractional divider value; and a transmitter configured to transmit a second data stream using at least the first clock signal.

Implementations may include one or more of the following features. The timing information is derived from the CDR circuit that aligns the first data stream with the reference clock signal. The sampler is configured to determine a transient phase offset using the first data stream. The first phase interpolator is configured to perform phase interpolation using the first control code and the first clock signal to generate a second clock signal. The sampler is configured to sample the first data stream using the second clock signal. The first filter is configured to generate a second control code by filtering the first control code. The system may further comprise a second phase interpolator configured to perform phase interpolation using the second control code and the first clock signal. The second phase interpolator is configured to determine a second phase interpolator offset, the first phase interpolator offset being associated with the second data stream. The system may further comprise a memory configured to store the first fractional divider value in a look-up table (LUT).

FIG. 1 is a simplified diagram illustrating a system for adjusting PLL according to embodiments of the subject technology. This diagram is merely an example, which should not unduly limit the scope of the claims. One of ordinary skill in the art would recognize many variations, alternatives, and modifications.

System 100 includes sampler [5], which generates samples from a received data stream (e.g., RX Data). For example, the sampler uses an initial clock signal, denoted as clk[3], to capture the phase information of incoming data, preparing it for further processing by the system. The system also includes a clock and data recovery (CDR) circuit, which receives the sampled data from the sampler and analyzes it to determine a phase offset between the received data stream and the system's clock. The CDR outputs a first control code (e.g., Control Code[6]) for the phase adjustment needed to align the system's timing with the received data. As an example, the RX sampler, utilizing clock signal clk[3], samples the RX serial information (e.g., data arriving at the RX Data input). The sampled data is processed by the CDR circuit, which determines the transient phase offset. The CDR then generates a control code (e.g., Control Code[6]) that adjusts the RX clock signal (e.g., clk[3]) via the RX Phase Interpolator, aligning the incoming data phase with the system clock to achieve synchronization. For example, a phase interpolator refers to a circuit used to generate a specific phase-adjusted output signal by interpolating between two or more reference clock signals with known phase differences. For example, PI can be used to provide precise control over the phase of an output clock signal by adjusting it in small increments between the phases of the input reference signals.

System 100 includes a first phase interpolator, labeled as "Phase Interpolator RX," which receives Control Code[6] and adjusts the RX clock (clk[3]) accordingly. For example, this component helps to fine-tune the phase of the received clock signal, reducing timing discrepancies between the incoming data and the system's reference.

Phase interpolator TX of system 100 is used for transmission. In various embodiments, it uses a control code (Control Code[7]) and a derived clock signal (e.g., clk[4]) from PLL (TX) to generate a timed TX clock signal. For example, this lock signal drives the transmitter and ensures that the outgoing data (TX Data) remains aligned with the system's overall timing.

Depending on the implementation, system 100 may employ single or multiple-phase interpolators on both the RX and TX paths, which generate phase-offset clock signals based on the divided clock, such as clk[3] for RX and clk[4] for TX. These phase interpolators allow fine-tuned control over the timing of the RX and TX signals, which is critical for maintaining data alignment in high-speed communication.

The programmable multi-stage filter, as illustrated in FIG. 1, processes the control signals to refine the adjustment applied to the PLL. As further described below, it includes mechanisms for gain selection and bandwidth adaptation, ensuring stability and dynamic response in the face of fluctuating phase offsets. By mitigating phase variations, the multi-stage filter helps maintain the smooth operation of the PLL and reduces jitter transfer to the transmitted signal. For adjusting PLL offset, the programmable multi-stage filter generates FrcN Divider Value (1) and FrcN Divider Value (2). For example, the programmable multi-stage filter serves as a control block capable of analyzing movements of the RX or TX phase interpolators (PI) to extract parts-per-million (PPM) offset data and subsequently control the operation of the OTFU-FrcN PLL. This programmable filter offers multiple gain settings and dynamically adjusts bandwidth to optimize instructions to the fractional divider values (FrcN values) while limiting steps to ensure system stability, especially for the PLL and the Loop Timing Filter.

System 100 additionally includes PLLs for providing adjusted clock signals. For example, system 100 includes two OTFU-FrcN_PLL blocks that allow on-the-fly updates to fractional divider values without causing clock glitches. For example, the PLLs use the fractional divider values. For example, FrcN Divider Value (1) and FrcN Divider Value (2) are provided by the programmable multi-stage filter for adjusting the effective frequency multiplication between the reference clock and the system's output frequency. This dynamic control minimizes the parts per million (PPM) offset between the local clock and the incoming data rate, ensuring stable synchronization. For example, the PLLs are implemented as the On-The-Fly Update Fractional-N Phase-Locked Loop (OTFU-FrcN PLL) components that are locked to the reference clock and support dynamic, on-the-fly fractional divider updates. This functionality enables the system to adjust the fractional divider values in real time without introducing clock glitches, ensuring smooth transitions in frequency multiplication between the reference clock and the voltage-controlled oscillator (VCO) frequency. For example, a fractional divider refers to a circuit used to divide an input clock frequency by a fractional (non-integer) value, allowing for fine-grained control over the output frequency. Unlike integer dividers, which divide by whole numbers, fractional dividers can produce an output frequency that is a fractional multiple of the input frequency. This enables a more flexible frequency synthesis, particularly useful in applications where precise tuning of the output frequency is required but does not align with simple integer division.

System 100 also includes optional clock dividers [2] and [8], which are configured in the RX and TX paths, allowing for fine control over the clock signals by modifying their frequencies. For example, the optional dividers enable the system to handle different clock rates and adapt to varying data transmission requirements. In various embodiments, optional clock clover divider [8] selects between the outputs of the two PLLs. For example, a cleaner signal selected between the two PLLs is selected. For example, optional PLL clock dividers [2] and [8] may be configured to fine-tune the frequencies of the RX and TX clock signals by dividing them. These dividers provide additional flexibility to adjust the clock rates, allowing system 100 to adapt to different data transmission requirements and operational modes.

System 100 additionally includes a loop timing filter, which removes high-frequency noise from the control signals generated by the CDR. By filtering out unwanted noise, this component improves the accuracy of timing signals used in subsequent clock adjustments, enhancing the overall stability of the PLL loop. For example, the loop timing filter comprises a low-pass filter that removes high-frequency noises. In various embodiments, through the selector "Optional Mux (2)", the programmable multi-stage filter may select the output of the CDR or the output of the loop timing filter, depending on which has a cleaner signal or code. For example, the loop timing filter processes the initial control code (e.g., Control Code[6]) generated by the CDR, filtering out high-frequency noise and producing a cleaner version of the control code. This filtered control code (e.g., Control Code[7]) is then applied to the TX phase interpolator, which uses it to adjust the TX clock phase, ensuring that the outgoing TX Data remains synchronized with the incoming RX Data.

For example, Optional Mux [1] in the system's control path allows switching between different control signals or clock sources, adding flexibility in handling various operational modes. It is to be appreciated that this flexibility enables optimized performance across multiple transmission conditions. For example, the transmission, or TX, section of system 100 can utilize clock signals clk[4] or clk[3] to generate the serial data for transmission.

In FIG. 1, the reference clock provides the base timing for the PLLs and other components. It works in conjunction with the programmable filter and fractional dividers to maintain the target frequency and phase alignment. For example, the reference clock in system 100 provides a stable timing source that meets stringent accuracy and stability criteria. It enables the CDR to maintain a sufficient locking range and supports the PLL in maintaining stable PPM offset values, thus reducing generated periodic jitter in the output data.

Figure 2:
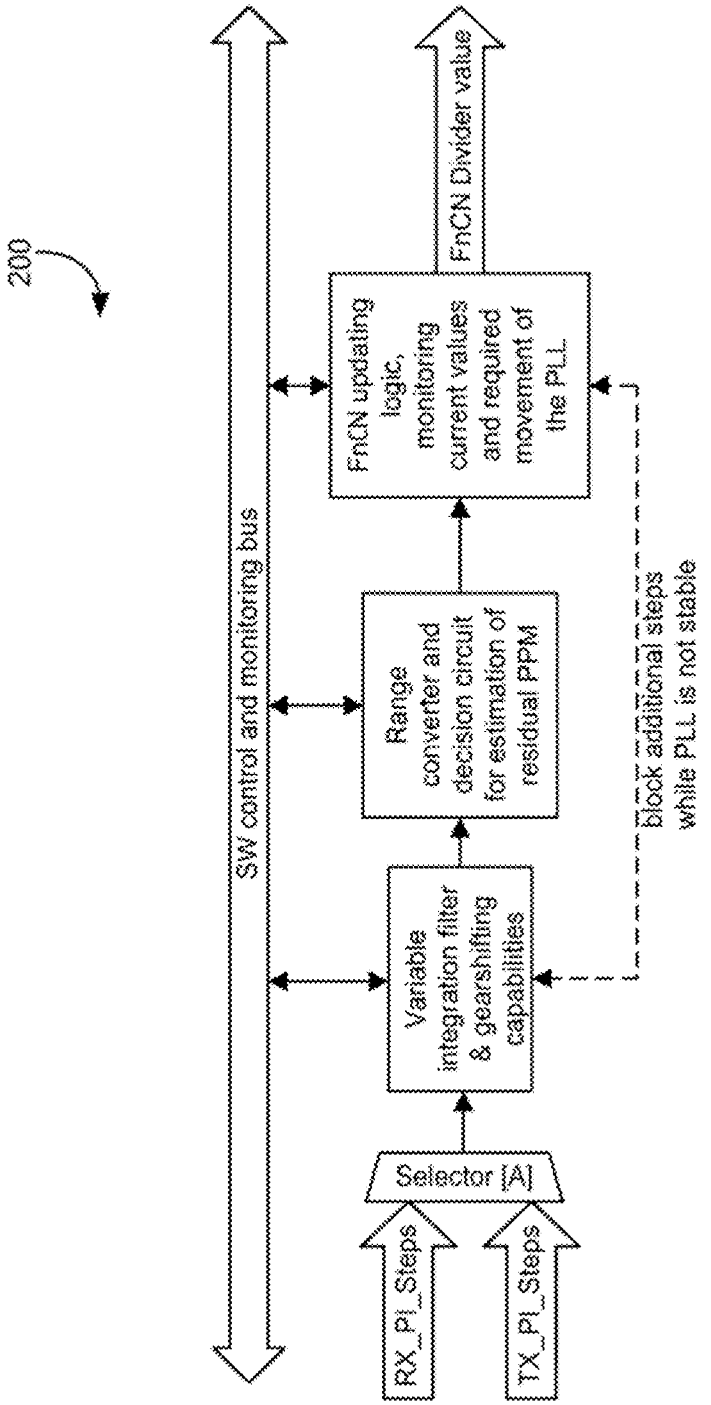
FIG. 2 is a simplified diagram illustrating the operation of a programmable multi-stage filter according to embodiments of the subject technology.

FIG. 2 is a simplified diagram illustrating the operation of a programmable multi-stage filter according to embodiments of the subject technology. This diagram is merely an example, which should not unduly limit the scope of the claims. One of ordinary skill in the art would recognize many variations, alternatives, and modifications. In various implementations, this filter dynamically manages phase interpolator steps and fractional divider updates to maintain system stability and minimize timing offsets. This diagram serves as an example and should not unduly limit the scope of the claims.

Selector (A). The filter begins by receiving phase interpolator steps from the RX (receive) path or TX (transmit) path, denoted as RX_PI_Steps and TX_PI_Steps. Selector (A) determines which set of phase interpolator steps to process, depending on the system's current operational requirements.

Variable Integration Filter & Gear-Shifting Capabilities. The selected phase interpolator steps are then fed into a variable integration filter that applies smooth transitions to the phase steps. For example, this block features gear-shifting capabilities that allow dynamic adjustments to the filter's gain and bandwidth. By adapting to the magnitude and frequency of the phase changes, this filter reduces abrupt phase shifts and smoothens the transitions, thereby improving PLL stability and minimizing jitter.

Range Converter and Decision Circuit. After filtering, the modified phase information is sent to a range converter and decision circuit. For example, this circuit estimates the residual parts-per-million (PPM) offset, a measure of frequency deviation, between the local PLL and the target frequency. Based on the estimated residual PPM, this circuit makes decisions on the necessary adjustments to the fractional divider values, aligning the PLL frequency more closely with the target signal.

FrcN Updating Logic. The FrcN updating logic block calculates the required fractional divider value to correct the phase offset. This module continuously monitors the current fractional divider values and updates them as needed. By providing real-time control over the fractional divider, the system ensures smooth, glitch-free updates to the PLL's frequency multiplication factor.

SW Control and Monitoring Bus. The software (SW) control and monitoring bus oversees the filtering and updating process. For example, it provides control commands and feedback loops to manage the system dynamically, ensuring that adjustments are only made when the PLL is in a stable state. If instability is detected, the bus can temporarily block additional steps, preventing further adjustments until stability is restored.

FrcN Divider Value Output. The output of the programmable multi-stage filter is the FrcN Divider value, which is passed to the PLL system. This value adjusts the PLL's frequency to minimize the PPM offset and align with the target timing requirements. It is to be appreciated that depending on the implementation, there can be other components as well.

Figure 3:
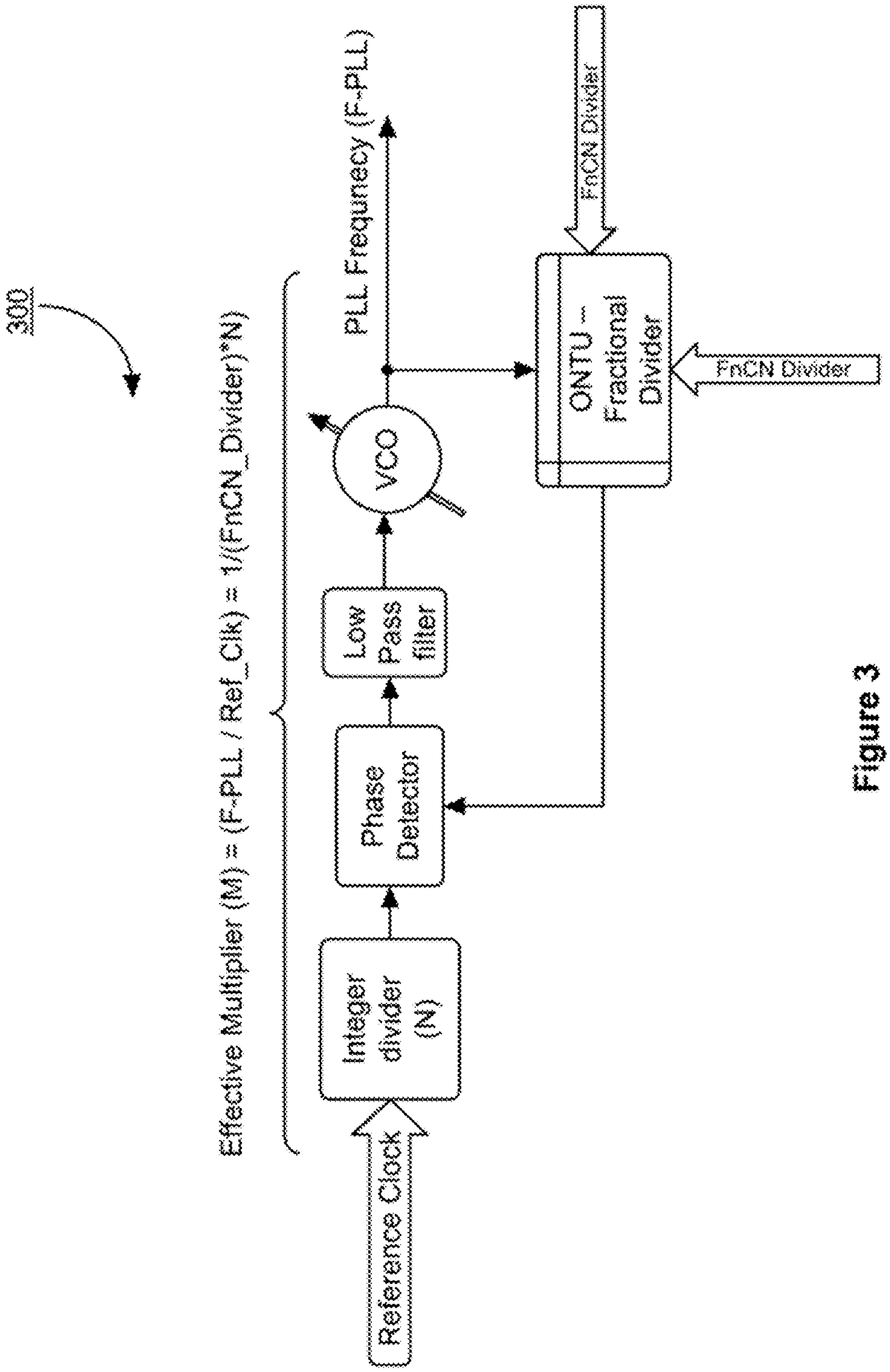
FIG. 3 is a simplified diagram illustrating a PLL according to embodiments of the subject technology.

FIG. 3 is a simplified diagram illustrating a PLL according to embodiments of the subject technology. This diagram is merely an example, which should not unduly limit the scope of the claims. One of ordinary skill in the art would recognize many variations, alternatives, and modifications. For example, PLL 300 comprises an OTFU-FrcN_PLL block referenced in FIG. 1.

The PLL begins with a Reference Clock input, which provides the stable base frequency for the PLL operation. For example, the reference clock is processed through an integer divider (N), which divides the input frequency by an integer factor N to achieve an initial frequency suitable for phase comparison and control within the PLL loop.

The output of the integer divider is fed into the phase detector as shown, which compares the phase of the divided reference clock with that of the PLL's output frequency (e.g., $F_{PLL}$). For example, the phase detector generates an error signal based on detected phase differences between the input and feedback signals. This error signal is used for adjusting the frequency of the PLL and maintaining synchronization with the reference clock.

The error signal generated by the phase detector is then passed through a low-pass filter. For example, the low pass filter smooths the error signal by removing high-frequency noise and transient fluctuations, providing a cleaner control signal to the next stage. This filtered control signal ensures that the PLL responds steadily to phase variations without abrupt adjustments that could introduce instability.

The output of the Low Pass Filter is provided to a voltage-controlled oscillator (VCO), which generates the PLL's output frequency (e.g., $F_{PLL}$). For example, the VCO adjusts its frequency based on the input control voltage, which reflects the cumulative phase and frequency differences detected by the Phase Detector. By continuously adapting to the control signal, the VCO maintains an output frequency that tracks the reference clock's frequency and phase, ensuring stable loop timing.

The output frequency of the VCO (F-PLL) is provided to a fractional divider (e.g., ONFU-Fractional Divider), which is configured as a part of a feedback path. For example, the fractional divider applies a fractional division factor, which is adjustable through an FrcN Divider value. For example, the FrcN Divider enables fine-grained control over the PLL's effective multiplication factor, defined by the equation:

$$\text{Effective Multiplier}(M) = F_{PLL}/Ref_{Clk}\}\} = 1/(FrcN_{Divider} * N)$$

It is to be appreciated that the ability to adjust the FrcN Divider value on the fly allows for smooth transitions in the output frequency without introducing glitches, as required in high-performance applications where timing precision is crucial.

In various embodiments, the Fractional Divider provides feedback to the phase detector. By adjusting the fractional value based on real-time conditions, the system minimizes phase errors and allows the PLL to maintain alignment with the reference clock, even under varying conditions.

Figure 4:
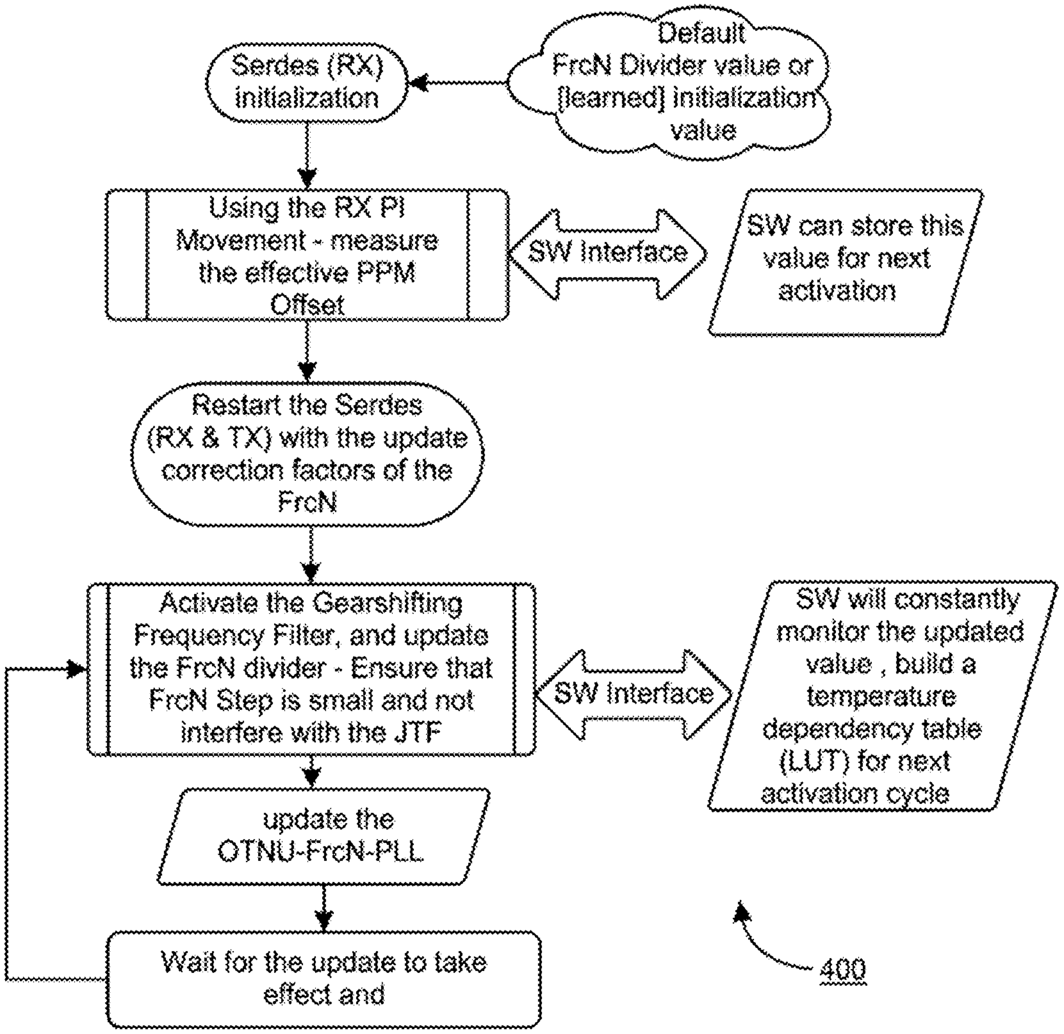
FIG. 4 is a simplified flow diagram illustrating operation of a system implementing PLL adjustment mechanism according to embodiments of the subject technology.

FIG. 4 is a simplified flow diagram illustrating the operation of a system using implementing PLL adjustment mechanism according to embodiments of the subject technology. This diagram is merely an example, which should not unduly limit the scope of the claims. One of ordinary skill in the art would recognize many variations, alternatives, and modifications. For example, a PLL is implemented in a Serializer/Deserializer (SerDes) system. Method 400 demonstrates the steps for initializing, measuring, and updating the fractional divider (FrcN) values in the OTFU-FrcN-PLL.

SerDes (RX) Initialization. The process begins with initializing the SerDes receiver (RX) section. During this initialization, a default FrcN Divider value or a previously learned initialization value is loaded. For example, the FrcN Divider value serves as the initial fractional divider setting for the PLL, defining the baseline frequency multiplier between the reference clock and the output clock.

PPM Offset Measurement via RX PI Movement. Using the RX phase interpolator movement, the system measures the PPM offset between the incoming data stream and the local reference clock. For example, this measurement provides a basis for determining any frequency discrepancies that need correction. The software interface (e.g., SW Interface) allows this measured PPM offset to be stored for future reference and adjustments during subsequent activation cycles.

SerDes Restart with Updated FrcN Correction Factors. Based on the PPM offset measurement, the system calculates an updated correction factor for the FrcN divider value. The SerDes (e.g., RX and TX sections) are then restarted, and this updated FrcN divider is applied to realign the RX and TX clocks with the corrected frequency offset. For example, this step ensures synchronized data transfer between the receiver and transmitter.

Activation of Gearshifting Frequency Filter. The system then activates a gearshifting frequency filter to fine-tune the PLL adjustment process. In various embodiments, this filter adapts the gain and bandwidth dynamically to ensure smooth transitions between fractional divider steps, which are kept minimal to avoid interfering with the jitter transfer function (JTF). The SW Interface provides feedback and control, allowing the filter settings to be adjusted as necessary to match operational conditions.

Updating the OTFU-FrcN-PLL. The OTFU-FrcN-PLL (On-The-Fly Update Fractional-N PLL) is updated with the refined FrcN divider value generated by the Gearshifting Frequency Filter. This value provides real-time frequency adjustment without inducing clock glitches, enabling seamless synchronization between the local PLL clock and the incoming data frequency.

Waiting for the update to take effect. Once the PLL update is applied, the system waits for the new settings to stabilize and take effect. For example, the pause ensures that the updated frequency parameters have been fully integrated into the system before further adjustments or data transmission occurs.

Monitoring and Building a LUT. Throughout the process, the SW Interface continuously monitors the FrcN divider value and other system parameters. This data is used to build a temperature dependency table or LUT that records optimal FrcN settings under different operational conditions. This LUT is used in future activation cycles to automatically load optimal divider values based on current temperature and other environmental factors, enhancing system stability and minimizing initialization time.

In an embodiment, the subject technology provides a method for generating synchronized clock signals in data communication systems by adjusting phase and frequency based on incoming data characteristics. The method starts by receiving a first data stream with a defined data rate and extracting timing information from this stream. A phase interpolator offset associated with the timing information is then determined, and an appropriate adjustment gain is selected. Using this gain, a first fractional divider value is generated to reduce the phase interpolator offset, which enables the production of a first clock signal by combining the fractional divider value with a reference clock signal. This first clock signal is then used to transmit a second data stream.

In another embodiment, the subject technology provides a system that includes a sampler generating samples from the first data stream, while a clock and data recovery (CDR) circuit determines a phase offset using these samples and produces a first control code. This first control code is applied to a first phase interpolator, which generates the first clock signal using both the first control code and a second clock signal. The system includes a first filter that generates a second control code by monitoring the movements of the first phase interpolator, and this second control code adjusts a phase-locked loop circuit to generate the second clock signal based on a third clock signal provided by a reference clock.

In another embodiment, the subject technology provides components for enhanced signal processing and control. In some configurations, a loop timing filter is included to remove high-frequency noise from the first control code, improving stability. The first filter may also include an integration module to determine an adjustment gain for precise tuning and a programmable multi-stage filter that dynamically adjusts the gain associated with the second control code. The second control code may contain a fractional divider value for further clock adjustment. There are other embodiments as well.

It is to be appreciated that embodiments of the subject technology offer substantial performance improvements by optimizing the control loop in PLL-based clocking systems, enabling these systems to perform reliably even with lower-grade reference clocks and under varying temperature conditions. Benefits include mitigating the effects of temperature drift, aging, and reduced stability requirements, ultimately leading to significant cost savings without compromising performance.

Even high-grade crystal oscillators (XTALs) are subject to performance degradation over time due to aging and temperature fluctuations. These factors can cause frequency drift, impacting timing accuracy in communication systems. Embodiments of the subject technology incorporate a dynamic control loop that continuously monitors and adjusts the PLL frequency, effectively compensating for temperature and aging effects. By managing frequency shifts in real-time, the system can suppress generated harmonics, keeping them below the detection threshold. This approach improves clock stability and precision beyond what the physical XTAL accuracy alone can achieve, ensuring reliable performance even as the crystal ages or is exposed to temperature variations.

For example, some existing approaches require highly accurate reference clocks with tight tolerance levels, such as +/−15 ppm, to maintain PLL stability and ensure synchronization. This level of precision often necessitates costly, high-grade XTALs with low temperature drift and high stability. With the advanced control mechanisms of the subject technology, the system's reference clock accuracy requirements can be significantly relaxed. Embodiments of the subject technology reduce the absolute accuracy needed from the reference clock to within the locking range of the clock and CDR circuit, instead of requiring high long-term stability. For example, the required accuracy of the XTAL can be reduced from +/−15 ppm to as low as +/−100 ppm, allowing the use of lower-grade crystals while maintaining system performance.

In addition to reducing initial accuracy requirements, embodiments of the subject technology provide a broader tolerance—compared to existing approaches—for clock stability over the lifespan of the component. Instead of relying on costly XTALs that maintain stringent stability across their entire lifespan, this system accommodates more affordable XTALs with broader tolerance ranges. The system can handle additional stability variations up to +/−50 ppm due to temperature changes and aging, further lowering the dependency on high-grade oscillators and reducing overall costs.

By relaxing both the accuracy and stability requirements of the reference clock, various implementations of the subject technology enable a reduction in the cost of components required for PLL synchronization. Lower-grade crystals or oscillators can be used instead of high-grade XTALs, leading to significant BOM savings. Despite the reduced component costs, the system's performance is enhanced, achieving a level of precision and stability previously only possible with high-grade oscillators. This improvement translates to cost-effective, high-performance solutions that offer a competitive advantage over prior systems that relied on expensive reference clock components.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. A system comprising:

a sampler configured to generate samples from a first data stream characterized by a first data rate;

a clock and data recovery (CDR) circuit configured to determine timing information associated with the first data stream and the first data rate and generate a first control code;

a first phase interpolator configured to generate a first clock signal using at least the first control code and a reference clock signal;

a first filter configured to generate a first fractional divider value by selecting a gain associated with a phase offset determined from the timing information;

a phase-locked loop (PLL) circuit configured to process the first clock signal using at least the reference clock signal and the first fractional divider value; and a transmitter configured to transmit a second data stream using at least the first clock signal.

2. The system of claim 1, wherein the timing information is derived from the CDR circuit that aligns the first data stream with the reference clock signal.

3. The system of claim 1, wherein the sampler is configured to determine a transient phase offset using the first data stream.

4. The system of claim 3, wherein the first phase interpolator is configured to perform phase interpolation using the first control code and the first clock signal to generate a second clock signal.

5. The system of claim 4, wherein the sampler is configured to sample the first data stream using the second clock signal.

6. The system of claim 3, wherein the first filter is configured to generate a second control code by filtering the first control code.

7. The system of claim 6, further comprising a second phase interpolator configured to perform phase interpolation using the second control code and the first clock signal.

8. The system of claim 7, wherein the second phase interpolator is configured to determine a second phase interpolator offset, the first phase interpolator offset being associated with the second data stream.

9. The system of claim 1, further comprising a memory configured to store the first fractional divider value in a look-up table (LUT).

10. A system comprising:

a sampler configured to generate samples using a first data stream;

a clock and data recovery (CDR) circuit configured to determine a phase offset using at least the samples and generate a first control code;

a first phase interpolator configured to generate a first clock signal using at least the first control code and a second clock signal;

a first filter configured to generate a second control code by determining a movement of the first phase interpolator using at least the first control code;

a reference clock generator configured to provide a third clock signal; and a phase-lock loop circuit configured to generate the second clock signal using the third clock signal and the second control code.

11. The system of claim 10, further comprising a loop timing filter configured to remove high-frequency noises from the first control code.

12. The system of claim 10, wherein the first filter comprises an integration module for determining an adjustment gain.

13. The system of claim 10, wherein the second control code comprises a fractional divider value.

14. The system of claim 10, wherein the first filter comprises a programmable multi-stage filter configured to determine a gain associated with the second control code.

15. The system of claim 10, further comprising a second phase interpolator configured to generate a fourth clock signal using at least the first control code and the second clock signal, the fourth clock being used for data transmission.

16. The system of claim 10, wherein the sampler is configured to perform sampling using at least the first clock signal.

17. A system comprising:

a sampler configured to generate samples using a first data stream and a first clock signal;

a clock and data recovery (CDR) circuit configured to generate a first control code using at least the samples;

a first phase interpolator configured to generate the first clock signal using at least the first control code and a second clock signal;

a first filter configured to generate a second control code by determining a movement of the first phase interpolator using at least the first control code;

a reference clock generator configured to provide a third clock signal; and a first phase-lock loop circuit configure to generate the second clock signal using the third clock signal and the second control code.

18. The system of claim 17, further comprising a loop timing filter configured to remove noise from the first control code.

19. The system of claim 17, further comprising:

a second phase-lock loop circuit configured to generate a fourth clock signal using the third clock signal and a third control code; and a second phase interpolator configured to generate a fifth clock signal using at least the first control code and the fourth clock signal.

20. The system of claim 19, wherein the first filter is configured to generate the third control code based on a movement of the second phase interpolator.

* * * * *